(12) United States Patent
Aggarwal et al.

(10) Patent No.: US 7,557,448 B2
(45) Date of Patent: Jul. 7, 2009

(54) HIGH-ASPECT-RATIO METAL-POLYMER COMPOSITE STRUCTURES FOR NANO INTERCONNECTS

(75) Inventors: Ankur Aggarwal, Smyrna, GA (US); Pulugurtha Markondeya Raj, Atlanta, GA (US); Rao R. Tummala, Stone Mountain, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 46 days.

(21) Appl. No.: 11/845,384

(22) Filed: Aug. 27, 2007

(65) Prior Publication Data

US 2008/0136035 A1 Jun. 12, 2008

Related U.S. Application Data

(62) Division of application No. 11/032,301, filed on Jan. 10, 2005, now Pat. No. 7,262,075.

(60) Provisional application No. 60/534,876, filed on Jan. 8, 2004.

(51) Int. Cl.
 *H01L 23/48* (2006.01)
(52) U.S. Cl. .................. 257/762; 257/E23.01
(58) Field of Classification Search .............. 257/773, 257/E21.575, E21.627, E21.641
 See application file for complete search history.

(56) References Cited

U.S. PATENT DOCUMENTS

| | | | |
|---|---|---|---|
| 6,165,629 A | 12/2000 | Sachdev et al. | |
| 6,286,226 B1 | 9/2001 | Jin | |
| 6,340,822 B1 | 1/2002 | Brown et al. | |
| 6,465,132 B1 | 10/2002 | Jin | |
| 6,477,225 B1 | 11/2002 | Morales et al. | |
| 6,692,680 B2 | 2/2004 | Lee et al. | |
| 6,919,164 B2 | 7/2005 | Lavallee et al. | |
| 7,262,075 B2 | 8/2007 | Aggarwal et al. | |
| 2001/0020549 A1* | 9/2001 | Horiuchi et al. | 174/263 |

(Continued)

OTHER PUBLICATIONS

Schietz, Jakob and Jacobson, Karsten; A mximum in Strength of Nanocrystaline Copper; Science Magizine; vol. 301, Sep. 5, 2003; pp. 1357-1359.*

(Continued)

*Primary Examiner*—Sue Purvis
*Assistant Examiner*—Krista Soderholm
(74) *Attorney, Agent, or Firm*—Troutman Sanders; James Hunt Yancey, Jr.; Ryan A. Schneider

(57) ABSTRACT

A low-temperature process that combines high-aspect-ratio polymer structures with electroless copper plating to create laterally compliant MEMS structures. These structures can be used as IC-package interconnects that can lead to reliable, low-cost and high-performance nano wafer-level packaging. High-aspect-ratio low CTE polyimide structures with low stress, high toughness and strength were fabricated using plasma etching. The dry etching process was tuned to yield a wall angle above 80 degrees leading to an aspect ratio higher than 4. The etching process also leads to roughened sidewalls for selective electroless plating on the sidewalls of the polymer structures. These fabricated structures show reduction in the stresses at the interfaces and superior reliability as IC-package nano interconnects. Metal-coated polymer structures from MEMS fabrication techniques can provide low-cost high-performance solutions for wafer-level-packaging. Other embodiments are also claimed and described.

20 Claims, 9 Drawing Sheets

U.S. PATENT DOCUMENTS

| | | |
|---|---|---|
| 2002/0142587 A1 | 10/2002 | Allen et al. |
| 2005/0017173 A1 | 1/2005 | Kumar |
| 2005/0136565 A1 | 6/2005 | Huff |
| 2005/0140026 A1 | 6/2005 | Salmon |
| 2005/0274227 A1 | 12/2005 | Aggarwal et al. |

OTHER PUBLICATIONS

International Technology Roadmap for Semiconductors-Assembly and Packaging, 2003 Edition, <http://public.itrs.net/Files/2003ITRS/Home2003.htm>.

Bakir, Muhannad et al., "Sea of Leads Ultra High-Density Compliant Wafer-Level Packaging Technology", 2002 Electronic Components and Technology Conference, 2002, pp. 1087-1094, IEEE Piscataway.

Ma, Lunyu et al., "J-Springs-Innovative Compliant Interconnects for Next-Generation Packaging", 2002 Electronic Components and Technology Conference, 2002, pp. 1359-1365, IEEE Piscataway.

Vandevelde, Bart et al., "Thermomechanical Models for Leadless Solder Interconnections in Flip Chip Assemblies", IEEE Transactions on Components, Packaging, and Manufacturing Technology, Mar. 1998, pp. 177-185, Part A, vol. 21, No. 1.

Martin, Lara J. et al., "Study on Metal Adhesion Mechanisms in High Density Interconnect Printed Circuit Boards", 2000 Electronic Components and Technology Conference, 2000, pp. 549-557, IEEE Piscataway.

Ge, J. et al., "Adhesion Between Photosensitive Epoxy and Electroless Copper", Adhesive Joing and Coating Technology in Electronics Manufacturing, Proceedings, 4th International Conference, Jun. 18-21, 2000, pp. 248-252.

Sarkar, G. et al., "Adhesion of Sputtered Copper to Photosensitive Epoxies", Journal of Material Science Letters, 1999, pp. 991-993, vol. 18.

Liu, Fuhan et al., "µ-Board Technology Development at Georgia Tech-Packaging Research Center", Proc. Of International Conference of Electronic Packaging, Apr. 16-18, 2003, pp. 187-192, Tokyo, Japan.

Li, Yiming et al., "Plasma Etching of Thick Polynorbornene Layers for Electronic Packaging Applicantions", Journal of Vacuum Science and Technology B: Microelectronic and Nanometer Structures, 2002, pp. 2007-2012, vol. 20, No. 5, 2002.

Aggarwal, Ankur et al., "New Paradigm in IC-Package Interconnections by Reworkable Nano-Interconnects", 2004 Electronic Components and Technology Conference, 2004, pp. 451-460.

Yoon, Ryonh-Kyu et al., "RF MEMS Based on Epoxy-Core Conductors", Solid State Sensors, Actuators and Microsystems Workshop, Jun. 2-6, 2002, pp. 374-375, Hilton Head Island, South Carolina.

\* cited by examiner

HIGH-ASPECT-RATIO METAL-POLYMER COMPOSITE STRUCTURES FOR NANO INTERCONNECTS

BENEFIT CLAIMS TO PRIOR APPLICATIONS

This application is a divisional application of U.S. application Ser. No. 11/032,301, filed 10 Jan. 2005, now U.S. Pat. No. 7,262,075, which claims priority to and the benefit of U.S. Provisional Application No. 60/534,876, filed 8 Jan. 2004. Each of these patent applications is hereby incorporated by reference as if fully set forth below.

GOVERNMENT INTERESTS

The present invention was made with government support by the National Science Foundation (NSF) through the NSF ERC in Electronic Packaging (EEC-9402723). The Government has certain rights in this invention.

FIELD OF THE INVENTION

The present invention is generally related to fabricating compliant polymer coated interconnects for nano wafer level packaging, and more specifically related to a fabrication and material scheme for low-stress interconnects using low-stiffness and low-CTE polymers for wafer-level interconnects and packaging.

BACKGROUND OF THE INVENTION

There are three main drivers for IC to package or board interconnects: high speed, unlimited I/O connections, and reparability. Compliant structures are essential to provide the interconnect reliability in fine-pitch wafer-level packaging. Yet, conventional approaches for interconnects, such as reflowed and electroplated solder interconnects, are limited in terms of either pitch or electrical properties. For example, solder bumps can only give thick (>50 micron interconnects) along with serious reliability problems.

Yet, with finer pitch, there is a large increase in the stresses at interconnect joints. Conventional compliant interconnect approaches to overcome this issue have complicated processing steps and the electrical properties are generally compromised to achieve the mechanical performance. These prior art attempts come with high cost and lengthy processing steps. For example, pure metallic interconnects or interconnects, even from newer materials such as carbon nanotubes, can result in higher interfacial shear and peeling stresses that also affect the mechanical reliability.

Known high-aspect-ratio structures concentrate on electroplating through micro-machined SU8 or other photoresist molds. Though SU8 can result in high-aspect-ratio structures, it does not have good mechanical properties to fabricate reliable MEMS structures.

Decreasing I/O pitch is one of the key technological barriers identified by the 2003 International Technology Roadmap for Semiconductors (ITRS) [1]. Downscaling traditional solder bump interconnect will not satisfy the thermo-mechanical reliability requirements at very fine pitches of the order of 30 microns and less. Recently, MEMS-based compliant metallic structures are being widely explored for reliable and high I/O density chip-package interconnections [2-3]. The lateral compliance of such interconnects can easily accommodate the displacement caused by the CTE mismatch. These interconnects can deform elastically in response to thermal or mechanical loads, thereby potentially increasing the testability and reliability of assembled wafer level packages. The design of compliant interconnects is of critical importance in optimizing their electrical and mechanical characteristics. These characteristics are intrinsically linked and both depend on the geometry of the structures and the properties of the materials used.

As previously noted, conventional compliant interconnect approaches have very complicated processing steps [2] and the electrical properties are generally compromised to achieve the mechanical performance [3]. Achieving compliance with simple metallic structures is difficult because of their inherently high stiffness. Advanced polymers with ultra-low stiffness (on the order of 0.5 GPa) and Simatched CTE (3 ppm/° C.) are now being synthesized for onchip interconnect and packaging applications. These polymers have 100-200 times lower stiffness than most metals, making it far easier to achieve compliance even with straight and short structures. Conductivity can be achieved with a metal coating on the polymer surface. Due to the skin effect, as long as the metal coating is large in thickness compared with the skin depth at the operating frequencies of interest, there is little to no degradation in electrical performance in polymer core structures compared to metallic structures.

Therefore, it can be seen that a need yet exists for an interconnect that can provide improved electrical performance while lowering the stresses at the interfaces by orders of magnitude. It is to such a structure, being a high-aspect-ratio metal-coated polymer structure, that the present invention is primarily directed. These polymer-based structures can also simplify the processing steps and result in tremendous cost reductions.

REFERENCES

[1] *International Technology Roadmap for Semiconductors—Assembly and packaging* (2003 edition); http://public-.itrs.net/Files/2003ITRS/Home2003.htm

[2] Muhannid Bakir, James Meindl et al., "Sea-of-lead ultrahigh density compliant wafer-level-packaging technology", *Proceedings, Electronic Components and Technology Conference*, IEEE Piscataway, pp. 1087-1094.

[3] Lunyu Ma, Qi Zhu and Suresh Sitaramanm; "J-Springs—Innovative Compliant Interconnects for Next-Generation Packaging", *Proceedings, Electronic Components and Technology Conference*, IEEE Piscataway, pp. 1359-1365.

SUMMARY OF THE INVENTION

Briefly described, in a preferred form, the present invention provides an optimum solution for high I/O microprocessor packages with very fine pitches and extremely high mechanical reliability and electrical performance at low costs. The invention presents a low-temperature process that combines high-aspect-ratio polymer structures with electroless copper/nickel plating to fabricate compliant polymer coated interconnects for nano wafer level packaging. The invention utilizes low cost materials and processes with a fairly simplified geometry, while retaining preferable mechanical and electrical performance.

Ultra low stiffness metal-coated polymer interconnects of the present invention provide the required compliance without achieving complicated geometries that damage the electrical performance of interconnects.

While polymers like SU8 are unsuitable, low CTE polymers that are compatible (CTE-matched) with board and IC and low-stiffness polymers that can act as stress-buffers (and thus induce minimal stresses at the interfaces and joints) are advantageous. CTE-high strength polyimides and low-stiffness polynorbornene are preferable polymers for the present application. These polymers also limit or eliminate the geometry restrictions (high-aspect-ratio), and hence will not comprise the electrical performance.

In preferred embodiments, the polymer has a stiffness less than approximately 1 GPa, as compared to other metallic interconnects with stiffness of 100 GPa, hence lowering the interfacial stress by several orders of magnitude.

The present invention comprises the processing of high-aspect-ratio (for example, 1:5; 4 micron wide and 20 micron tall; with 8 micron pitch) metal-coated polymer structures that can provide the electrical and mechanical performance required of interconnects, while lowering the stresses at the interfaces by several orders.

In one embodiment, a commercial high-temperature polynorbornene-based thermosetting polymer with ultra low stiffness (approximately 0.5 GPa) that can act as a stress buffer is used for the metal-coated polymer interconnect for nano wafer-level packaging applications. The micro-machining is done with plasma reactive ion etching. The etching conditions (Oxygen/fluorine ratio, pressure, power) are optimized to get the required high-aspect-ratio geometry, side wall definition while maintaining the rough-surfaces suitable for subsequent electroless plating and minimal residue formation in between the 3-5 micron structures. For example, while PI 2611 is a superior polymer for the present application, it is not available in photodefinable form. In such cases, dry plasma etching can achieve the required polymer aspect ratios. Electroless plating selectively occurs on the roughened polymeric surface because of specific catalyst interaction with the polymers. The dry etching results in a wall angle of approximately 80 degrees, and can lead to an aspect ratio higher than 4.

The etching process also leads to roughened side walls that can give selective electroless plating on the side walls of the polymer structures.

Fine pitch chip-package interconnections of the present invention can be achieved with electroless nickel-plating (approximately 1 micron) on the roughened polymeric surface.

These and other objects, features and advantages of the present invention will become more apparent upon reading the following specification in conjunction with the accompanying drawings.

DETAILED DESCRIPTION OF A PREFERRED EMBODIMENT

Figure 1:
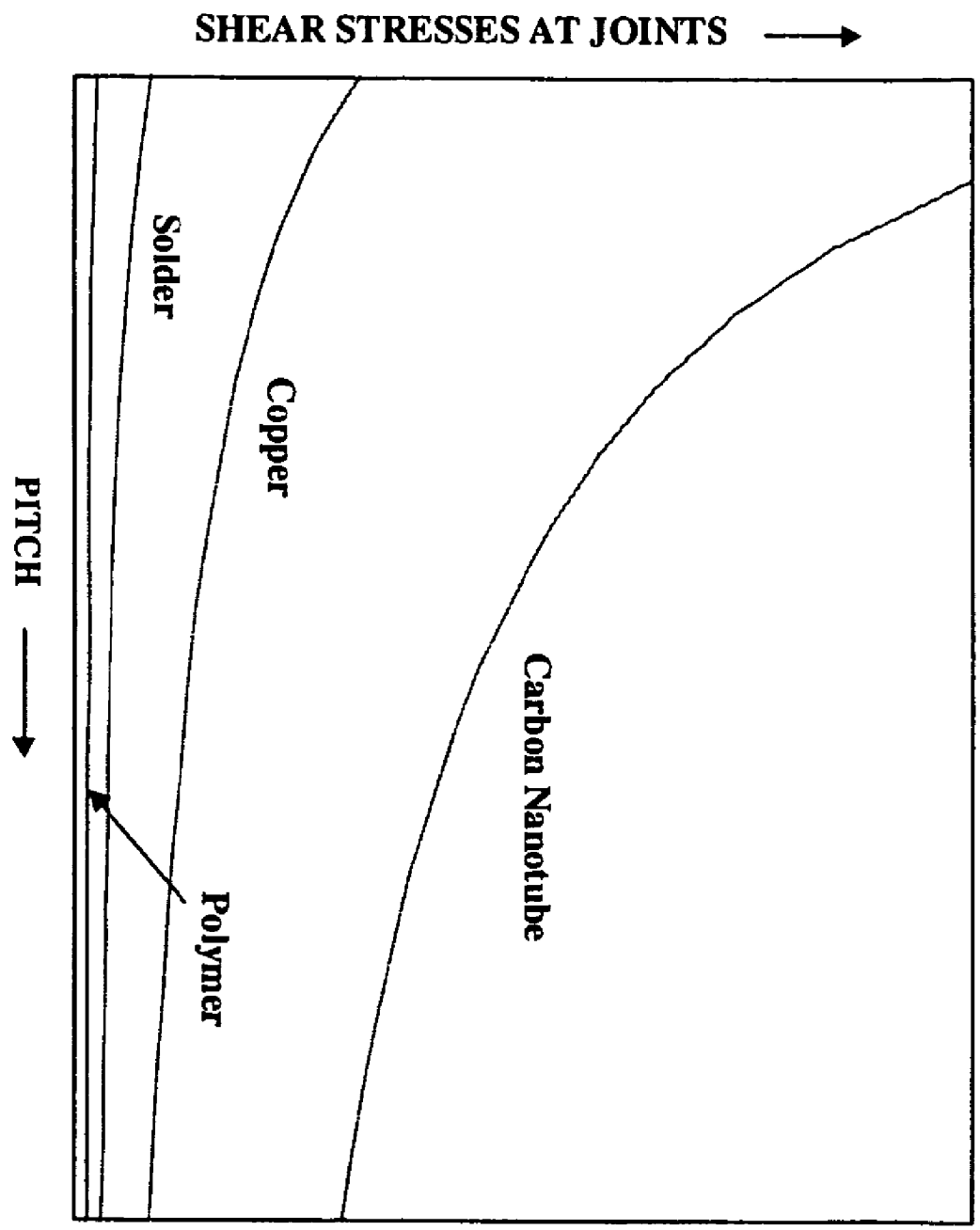
FIG. 1 is a graph illustrating the role of interconnect modulus on interfacial shear stresses.

Referring now in detail to the figures, wherein like reference numerals represent like parts throughout the several views, FIG. 1 shows the interfacial shear stresses at joints as a function of pitch using different interconnect materials, including polymers, solder, copper and carbon nanotube. Polymer interconnects present lowest stresses at the joints. The stresses were computed by modeling the IC-board interconnects using elastic beam theory [4].

Figure 2:
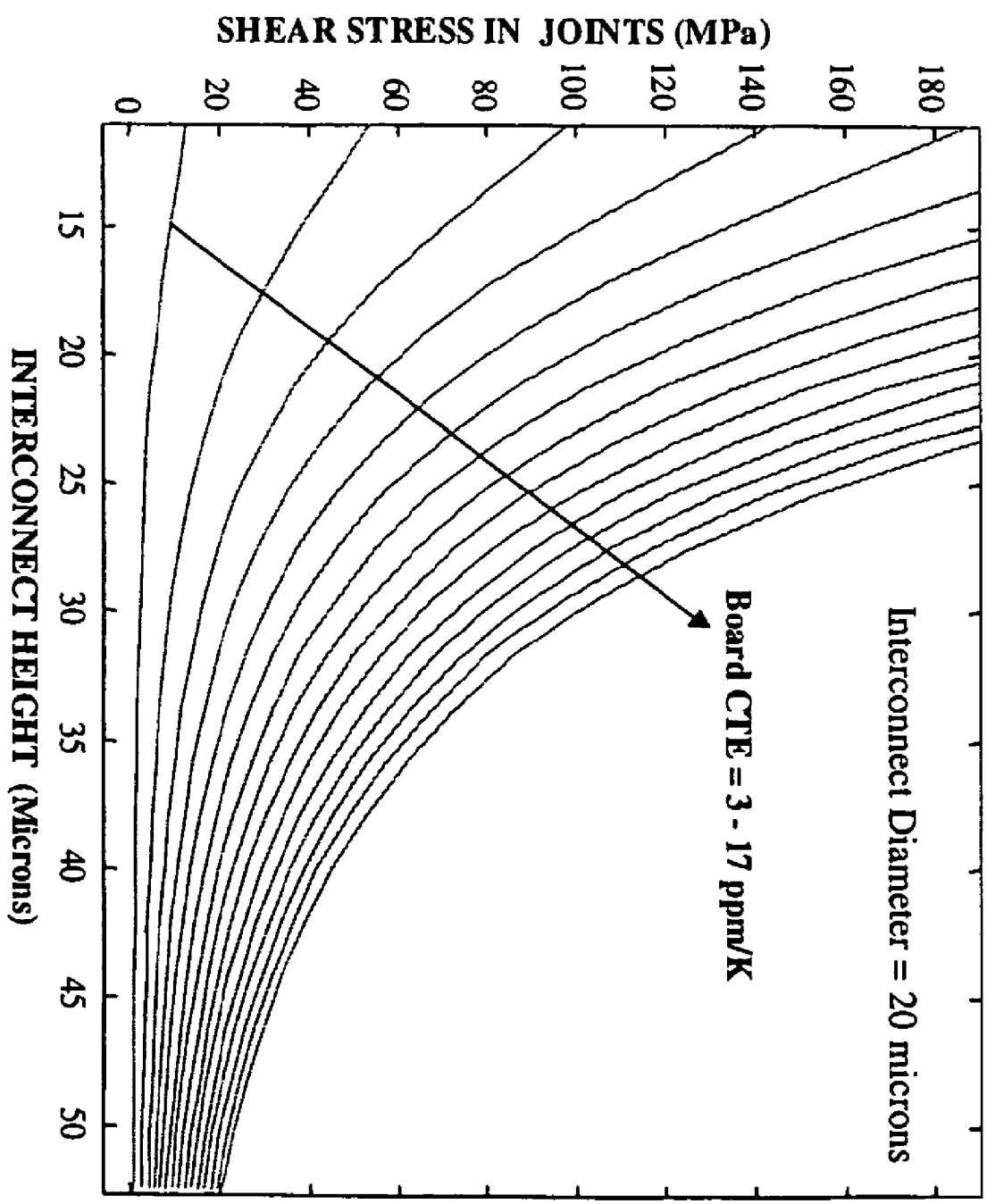
FIG. 2 is a graph illustrating the role of high-aspect-ratio in lowering the interfacial stresses in polymer interconnects.

FIG. 2 shows the variation of stresses with height of the interconnects when the interconnect diameter is kept constant. It can be seen that the use of low stiffness interconnects can lower the stresses at the interface to within the elastic limit and increase the reliability even with vertical structures with a nominal aspect ratio of 3-4 that are easiest to fabricate and provide excellent electrical properties.

Electroless copper adhesion to untreated polymers is typically poor due to the original smooth polymer surface. To achieve sufficient adhesion, chemical treatment is generally used because of its simplicity and low cost. While a Cr layer is typically used to improve the adhesion strengths in sputtering processes (complemented with oxygen plasma treatment to increase the reactivity of Cr, resulting in metal oxide with higher peel strengths [5]), surface roughening techniques are usually employed for direct copper electroless plating. Though permanganate etching is used for its low cost, oxygen plasma etching is also known to induce comparable surface roughening, more than that achieved from ion etching [6]. Hong et al. report that the adhesion strengths of copper on epoxies are 2.7 N/mm$^2$, 4.2 N/mm$^2$ and 8.8 N/mm$^2$ with bare copper, Cr adhesive layer and plasma roughening, respectively [7]. Adhesion strengths achieved with electroless plating on permanganate-etched epoxies are found to be 9.5-10 N/mm$^2$; almost approaching that of laminated copper.

The adhesion strength of electroless copper with epoxy depends on the extent of mechanical interlocking and thereby the surface morphology of epoxy plays an important role in defining the adhesion. Micron level anchoring structures are shown to provide the best adhesion. Conventional epoxies are frequently blended with a soluble (imidazole Vs Amine hardner) or removable filler (silica) to achieve the required sub-micron to micron range topography that improves the adhesion [8]. In testing, Oxygen/Fluorocarbon plasma or conventional permanganate wet etching treatment did not create enough roughening of the SU8. Insufficient sidewall roughening resulted in poor adhesion and possible delamination of plating on the sidewalls.

SU8 is a brittle polymer with tensile strength and elongation to failure typically reported as 40-50 MPa and 5% as compared to other conventional epoxies (80 MPa, 8%) or polyimide (200-300 MPa, 12%). Because of its high strength, polyimide can be a more reliable mechanical structure. It becomes a logical choice to select a polymer material that has sufficient strength for high mechanical reliability as well as should have good adhesion with the electroless plated copper. Thus, polynorbornene (0.5 GPa modulus) and polyimide (3 ppm/C CTE) were selected for testing.

Figure 3:
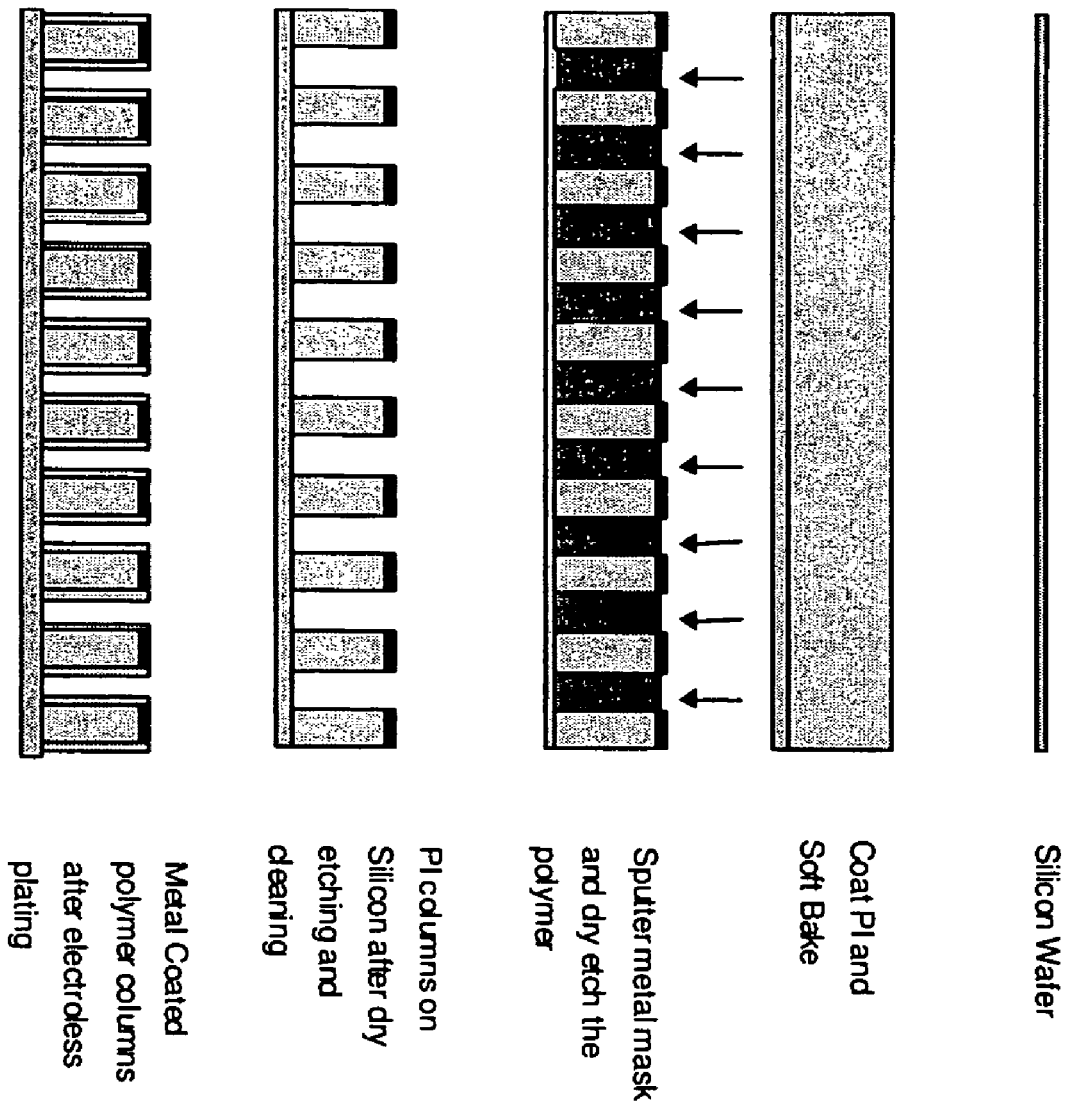
FIG. 3 is a process flow of a fabrication method of metal-coated polymer interconnects.

High-aspect-ratio structures with far higher toughness and strength were fabricated as shown in the process flow in FIG. 3. Micro machining of polymer coating is carried out with dry plasma etching that leads to the required surface roughening.

Figure 4:
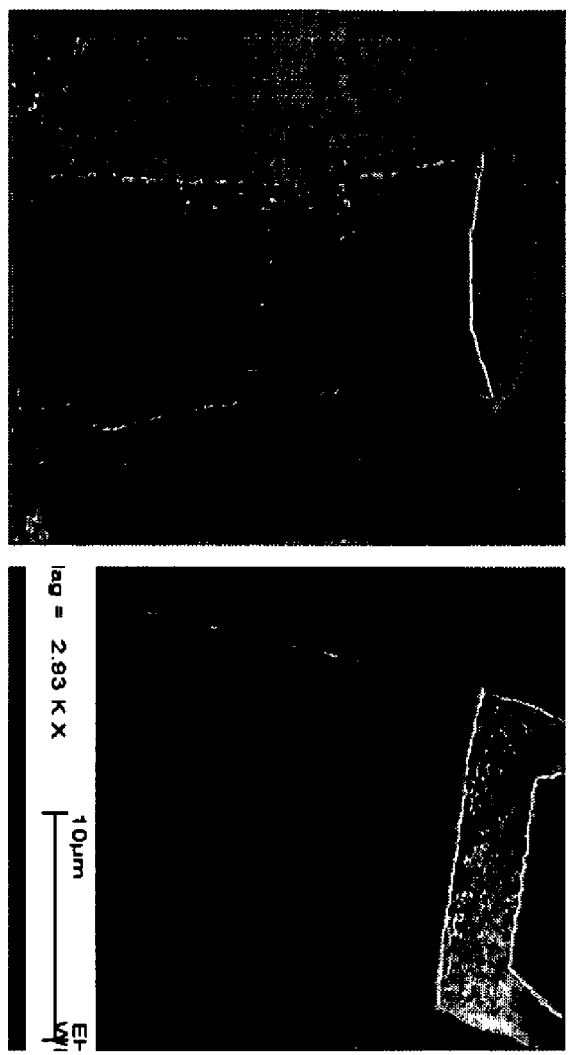
FIG. 4 is a comparison of surface roughening from dry etched structures (left) to photo-defined structures followed by etching (right).
Figure 5:
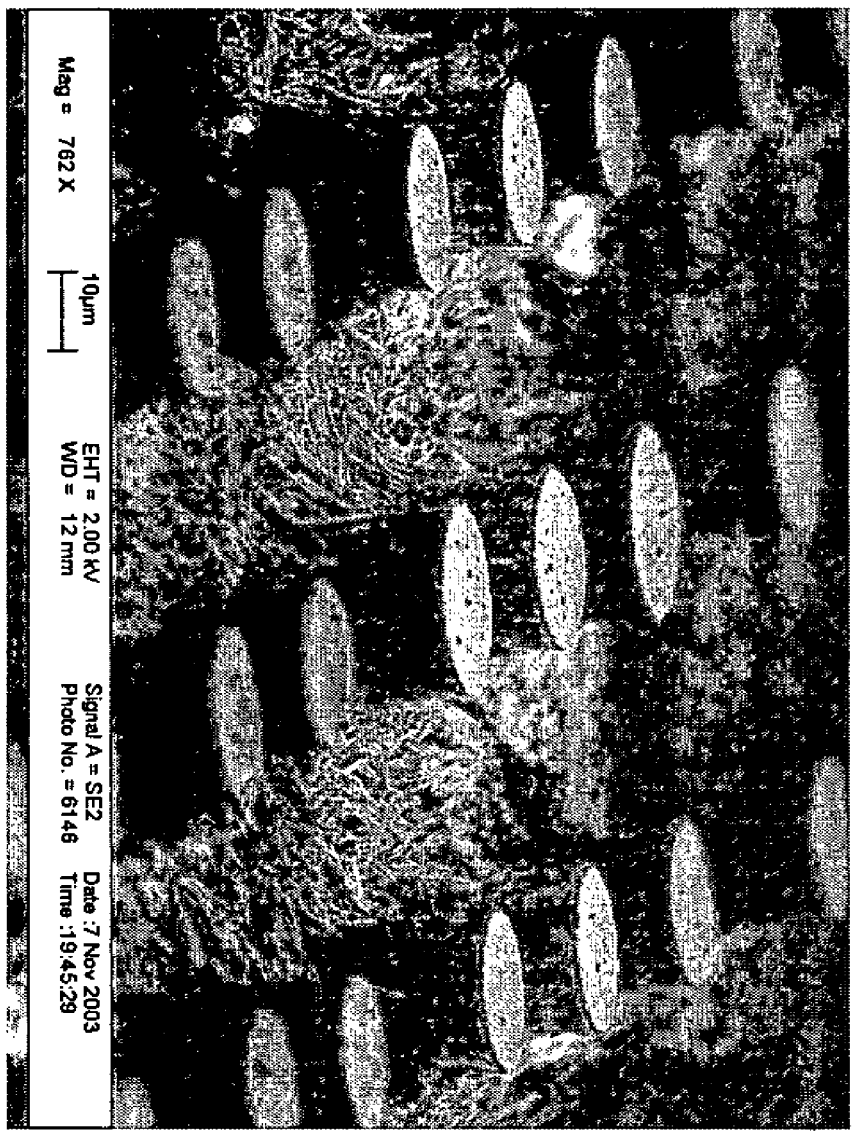
FIG. 5 illustrates the polyimide structures after dry etching, which leads to a "grassy" residue between the structures that can be removed easily by ultrasonic cleaning.
Figure 6:
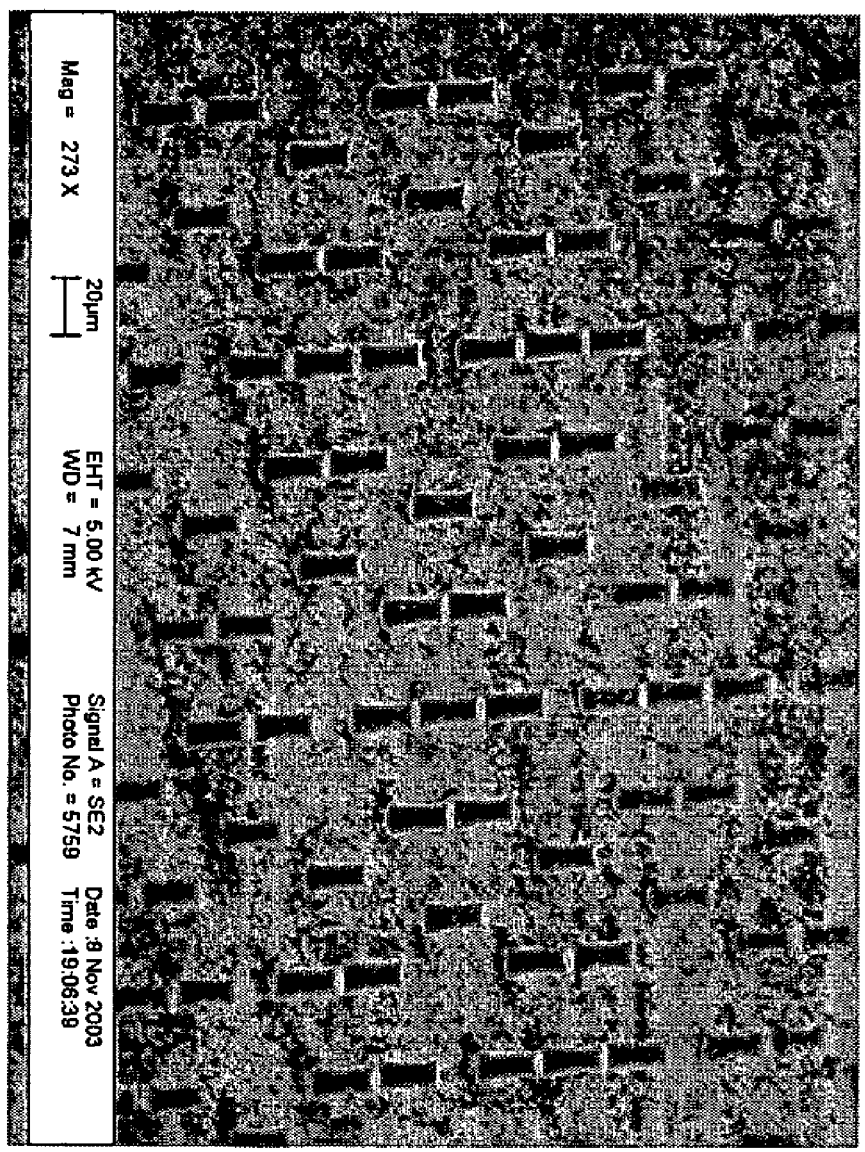
FIG. 6 illustrates the high-aspect-ratio polyimide structures after dry etching and ultrasonic cleaning.

A typical optical micrograph of dry etched polymeric structures in comparison with photo-defined SU8 followed by plasma etching is shown in FIG. 4. The etching conditions (Oxygen/fluorine ratio, pressure, power) can be optimized to get the required high-aspect-ratio geometry and sidewall definition while maintaining the rough-surfaces suitable for subsequent electroless plating. In testing, electroless plating selectively occurs on the roughened polymeric surface because of specific catalyst interaction with the roughened polymers. Dry etching typically leads to "grass effect" as discussed by Li and Hess [9]. A subsequent ultrasonication step can clean the structures effectively. FIGS. 5 and 6 show the polymer structures before and after ultrasonic cleaning.

Electroless plating involves reduction of complexed copper ions using formaldehyde in aqueous solution. It has several advantages over electroplating because of its excellent selectivity, excellent conformability and does not require direct electrical contact. Electroless copper adhesion to untreated epoxy is typically poor due to the original smooth polymer surface. To achieve sufficient adhesion, chemical treatment is generally used because of its simplicity and low cost.

The steps involved in electroless plating are briefly summarized as:

1. Swell: Diethylene glycol and n-butyl ether—cleans, conditions and activates surfaces, making them more susceptible to subsequent etching.
2. Etch: Alakaline permanganate treatment to selectively remove materials.
3. Neutralize: p-toluene sulphonic acid to clean the surface from permanganate residues.
4. Predip/Catalyst: Tin/palladium chloride to seed non-conductive surfaces for uniform and complete deposition of copper.
5. Electroless plate: Typically comprises a source of copper ions (copper sulfate), an active reducing agent (formaldehyde), sodium hydroxide, a complexing agent such as EDTA (Ethylene Diamine Tetra Acetic Acid). The plating rate is typically 5 microns/hr at 45 C. The molds were electroless-plated with copper to thickness greater than 2 microns.

Figure 7:
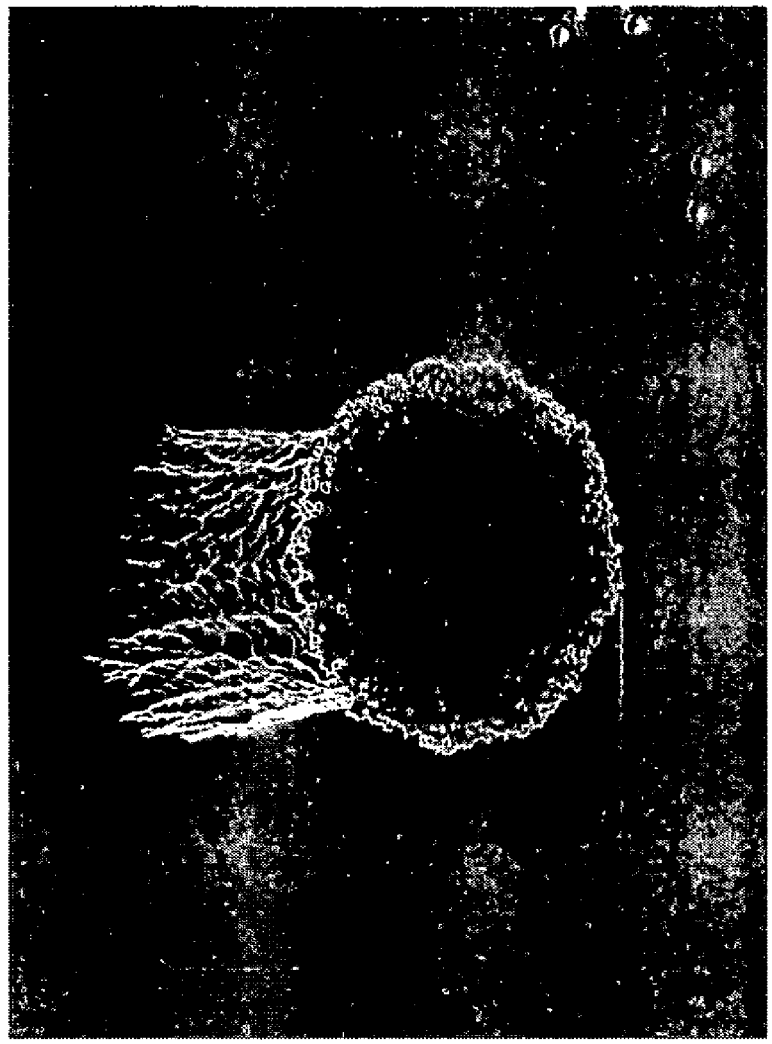
FIG. 7 illustrates metal coated polymer structures with copper electroless plating on the sidewalls.

A typical high-aspect-ratio low CTE (3 ppm/C) polyimide structure with an aspect ratio more than 4 is shown in FIG. 4. The dry etching results in a wall angle close to 80 degrees and can lead to an aspect ratio greater than 4. The etching process also leads to roughened sidewalls that can give selective electroless plating on the sidewalls of the polymer structures (FIG. 7).

Li and Hess report that higher powers in reactive ion etching resulted in increased generation of reactive radicals and therefore greater etching [9]. Higher power also causes greater acceleration of ions leading to more physical sputtering. Hence, the overall etch rate is a strong function of power. Pressure has two opposing effects on etch rate. As the pressure is decreased, the DC bias increases which increases the etch rate by increased sputtering. On the other hand, the density of radicals and ions is less at lower pressures which leads to lower etch rates.

It was also observed that conditions that promote high etch rates also result in worse uniformity [9]. The etch rate is always higher at the wafer edge and gradually decreases toward the center indicating a local gas phase depletion effect. Since the uniformity improves with increasing flow, depletion of Fluoride radicals must be the limiting factor for uniformity. In general, higher powers and the corresponding higher etch rates cause greater depletion and hence worse uniformity. Lower pressure and the corresponding higher gas velocity reduce gas phase depletion effects and hence improve uniformity. This effect of pressure on uniformity is stronger at higher powers where the depletion effect is greater.

Figure 8:
FIG. 8 illustrates metal coated polymer structures with a pitch of 20 microns, a diameter of 10 microns, and a height of 25 microns.
Figure 9:
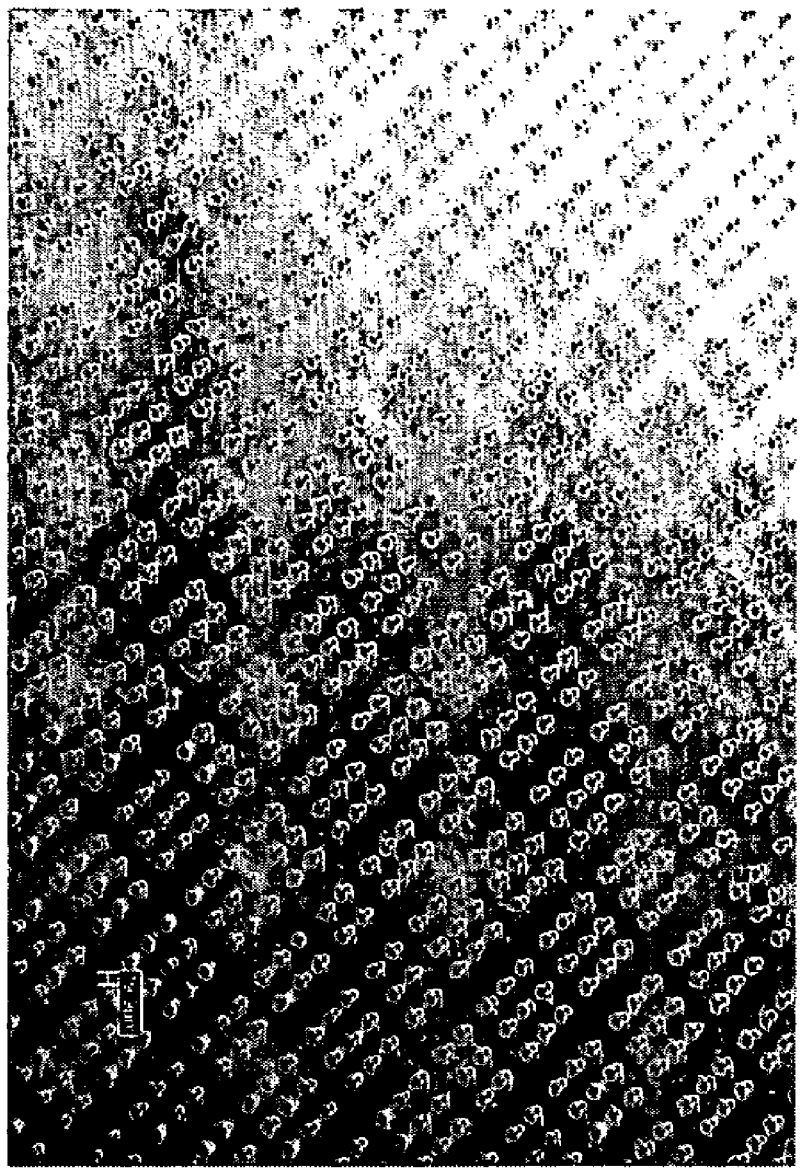
FIG. 9 illustrates the large area fabrication of metal coated polymer structures with a pitch of 20 microns, a diameter of 10 microns, and a height of 50 microns.

An electroless process was then used to deposit nanostructured copper film on the polymer structures without an external power source. The incorporation of additives requires careful control of the plating solution, selection of reducing agents and control over processing conditions. The copper grain size was of the order of 20-30 nm. Uniform metal deposition and constant plating rate are maintained by rigid control of pH and concentration of chemicals in the stabilized plating bath. Since the plating process is strictly chemical, it evenly coats the surface of polymer structures (FIG. 7). Large-area fabrication of these metal coated polymer interconnect structures are shown in FIGS. 8 and 9.

The advantages of getting fine pitch interconnects can be availed by having an elegant bonding method with nanodimensional bonding interfaces. Lead-free solder films formed from electroless plating can be used to bond these interconnects with the copper pads on the substrate [10]. This technology can be easily downscaled to any geometry and therefore is a promising solution to address future I/O requirements.

As previously discussed, metallic structures are widely being used for various MEMS and interconnect applications though they show severe limitations in performance and reliability. The present invention provides a metal-polymer composite structures to replace metallic structures for IC-package interconnects. Analytical modeling was used to show the advantages of such composite structures. High-aspect-ratio copper-coated polyimide structures can be fabricated from plasma etching and electroless copper plating. Side-wall adhesion of metal to the polymer and polymer adhesion to the underlying substrates are critical for processing of metal-coated polymers. While photodefinable polymers can simplify the processing cost, dry plasma etching process can give more flexibility in the selection of polymers. Metal polymer composite structures are also suitable for several other applications like tunable capacitors for MEMS based RF components. Similar structures for high Q inductors [11] are being recognized.

While the invention has been disclosed in its preferred forms, it will be apparent to those skilled in the art that many modifications, additions, and deletions can be made therein without departing from the spirit and scope of the invention and its equivalents, as set forth in the following claims.

REFERENCES

[4] Vandevelde, B., Christians, F., Beyne, E., Roggen, J. Peeters, J., Allaert, K., Vandepitte, D., Bergmans, J., "*Thermomechanical models for leadless solder interconnections*" IEEE Transactions on Flip chip assemblies components, Packaging, and Manufacturing Technology, Part A, Volume: 21, Issue: 1, March 1998.

[5] Lara J. Martin, "Study on metal adhesion mechanisms in high density interconnect Printed Circuit Boards", *Proceedings—Electronic Components and Technology Conference*, IEEE Piscataway, N.J., USA, pp. 549-557.

[6] J. Ge, R. Tuominen and J. K. Kivilahti, "Adhesion between photosensitive epoxy and electroless copper", *Adhesive Joining and Coating Technology in Electronics Manufacturing*, 2000. Proceedings., 4th International Conference on 18-21 Jun. 2000 pp. 248-252.

[7] G. Sarkar and B. H. Kong, "Adhesion of sputtered copper to photosensitive epoxies", *J. Mater. Sci.*, V. 18, 12, 1999.

[8] Fuhan Liu, Venky Sundaram, Ankur O. Aggarwal, George White, Dean Sutter, Rao Tummala, "Micro-Board Technology Development at the Packaging Research Center", *Proc. of International Conference of Electronic Packaging*, pp. 187-192, Apr. 16-18, 2003, Tokyo, Japan.

[9] Yiming Li and Dennis Hess, "Plasma etching of thick polynorbornene layers for electronic packaging applications", *Journal of Vacuum Science and Technology B*: Microelectronics and Nanometer Structures, v 20, n 5, 2002, pp. 2007-2012.

[10] Ankur O. Aggarwal, I R Abothu, P. Markondeya Raj, M. D. Sacks, Rao R. Tummala, "New paradigm in IC-package interconnections by reworkable nano-interconnects", Proceedings—Electronic Components and Technology Conference, 2004, unpublished.

[11] Ryong-Kyu Yoon, Jin Woo Park and Mark Allen, "RFMEMS based on epoxy core conductors", *Solid State Sensors, Actuators and Microsystems Workshop*, Hilton Head Island, S.C., Jun. 2-6, 2002, pp. 374-375.

We claim:

1. A nano interconnect structure to connect an integrated circuit to a substrate, the structure comprising:
    a polymer material having a stiffness less than approximately 1 GPa;
    the polymer material having a pattern to provide a plurality of polymer columns, each defining an outer surface, the polymer material comprising at least one of polyimide or polynorbornene;
    the outer surfaces of the polymer columns further comprising a plurality of anchoring elements formed on the outer surfaces; and
    the polymer columns coated with metal such that the metal attaches to at least a portion of the anchoring elements formed on the outer surfaces so that a plurality of nano interconnections are formed.

2. The structure of claim 1, wherein the wall angle of the metal coated polymer columns is greater than approximately 80 degrees.

3. The structure of claim 1, wherein the pattern is etched by dry plasma.

4. The structure of claim 1, wherein the metal is copper.

5. The structure of claim 1, wherein the polymer columns are coated with metal by electroless plating.

6. The structure of claim 1, wherein the polymer columns are coated with metal by direct copper electroless plating.

7. The structure of claim 1, wherein the grain size of the copper is between approximately 20-30 nm.

8. The structure of claim 1, wherein the resultant metal coated polymer columns have an aspect ratio of greater than approximately 4.

9. An electrical nano interconnection structure to connect a base wafer to another surface to form part of an IC-package, the structure comprising:
    a base wafer coated with a polymer material having a stiffness less than approximately 1 GPa;
    the polymer material having a pattern to provide a plurality of polymer columns, wherein the polymer columns are created by etching, and wherein the polymer columns have outer surfaces;
    the outer surfaces of the polymer columns further comprising a plurality of anchoring elements formed on the outer surfaces, wherein the anchoring elements are created by at least one of physical or chemical roughening;
    the polymer columns coated with metal so that the metal attaches to at least a portion of the plurality of anchoring elements; and
    the metal coated polymer columns disposed between the base wafer and another surface so that electrical nano interconnections are formed between the base wafer and another surface to form part of an IC-package.

10. The structure of claim 9, wherein the polymer material comprises at least one of polyimide or polynorbornene.

11. The structure of claim 9, wherein the polymer material is etched with dry plasma, and wherein dry plasma etching provides roughened side walls of the polymer columns.

12. The structure of claim 9, wherein the metal is copper.

13. The structure of claim 9, wherein the polymer columns are coated with metal by direct copper electroless plating, and wherein the roughened side walls aid in the adhesion of the copper.

14. The structure of claim 9, wherein the resultant metal coated polymer columns have an aspect ratio of greater than approximately 4.

15. A nano interconnect structure to connect an integrated circuit to a substrate, the structure comprising:
    a plurality of polymer columns, each defining an outer surface;
    a plurality of anchoring elements disposed on at least a portion of the outer surfaces of the polymer columns; and
    the polymer columns coated with metal such that the metal attaches to at least a portion of the anchoring elements formed on the outer surfaces so that a plurality of nano interconnections are formed.

16. The nano interconnect structure of claim 15, wherein the polymer material has a stiffness less than approximately 1 GPa.

17. The nano interconnect structure of claim 15, wherein the metal coated polymer columns have an aspect ratio of greater than approximately 4.

18. The nano interconnect structure of claim 15, wherein the metal coated polymer columns are disposed between two spaced apart surfaces so that electrical nano interconnections are formed between the surfaces to form part of an IC-package.

19. The nano interconnect structure of claim 15, wherein the anchoring elements are created by at least one of physical and chemical roughening of the polymer columns.

20. The structure of claim 15, wherein the polymer material is etched with dry plasma, and wherein dry plasma etching provides roughened side walls of the polymer columns.

* * * * *